United States Patent [19]
Ohura et al.

[11] Patent Number: 5,818,281
[45] Date of Patent: Oct. 6, 1998

[54] SEMICONDUCTOR CIRCUIT HAVING TURN-ON PREVENTION CAPABILITY OF SWITCHING SEMICONDUCTOR DEVICE DURING OFF CYCLE THEREOF BY UNDESIRED TRANSIENT VOLTAGES

[75] Inventors: Hitoshi Ohura; Koji Kawamoto; Shoichi Ozeki, all of Hitachi, Japan

[73] Assignees: Hitachi, Ltd., Tokyo; Hitachi Haramachi Electronics Co.,Ltd., Hitachi, both of Japan

[21] Appl. No.: 528,887

[22] Filed: Sep. 15, 1995

[30] Foreign Application Priority Data

Sep. 20, 1994 [JP] Japan .................................. 6-224753

[51] Int. Cl.$^6$ .................................................. H03K 17/16
[52] U.S. Cl. ........................................... 327/381; 327/198
[58] Field of Search ................................... 327/360, 381, 327/382, 383, 384, 389, 391, 392, 399, 401, 309, 431, 432, 434, 545, 546, 198, 427, 478, 143; 307/130; 323/238, 321

[56] References Cited

U.S. PATENT DOCUMENTS

| | | | |
|---|---|---|---|
| 3,819,952 | 6/1974 | Enomoto et al. | 327/389 |
| 3,909,674 | 9/1975 | Spence et al. | 327/382 |
| 4,039,865 | 8/1977 | Ohhinata et al. | 307/252 G |
| 4,041,332 | 8/1977 | Ohhinata et al. | 307/252 J |
| 4,084,110 | 4/1978 | Okuhara et al. | 307/252 G |
| 4,184,086 | 1/1980 | Sagawa et al. | 307/252 J |
| 4,551,643 | 11/1985 | Russell et al. | 307/570 |
| 4,992,683 | 2/1991 | Robin, Jr. | 307/570 |
| 5,055,721 | 10/1991 | Majumdar et al. | 307/570 |
| 5,072,143 | 12/1991 | Gantioler et al. | 307/643 |
| 5,148,253 | 9/1992 | Kimura | 357/38 |
| 5,287,023 | 2/1994 | Miyasaka | 327/389 |
| 5,434,527 | 7/1995 | Antone | 327/391 |
| 5,475,333 | 12/1995 | Kumagai | 327/389 |

FOREIGN PATENT DOCUMENTS

| | | | |
|---|---|---|---|
| 352032660 | 3/1977 | Japan | 327/381 |
| 358136137 | 8/1983 | Japan | 327/389 |
| 60-112318 | 6/1985 | Japan . | |
| 60-167522 | 8/1985 | Japan . | |
| 63-099779 | 5/1988 | Japan . | |
| A-63-99779 | 5/1988 | Japan . | |
| 363139421 | 6/1988 | Japan | 327/389 |
| 363187815 | 8/1988 | Japan | 327/381 |
| 63-187815 | 8/1988 | Japan . | |

OTHER PUBLICATIONS

IEEE, Proceedings of the Industry Applications Society Annual Meeting, Oct. 4, 1992, vol. 1, pp. 1186–1195, "Gate Drive Considerations for IGBT Modules", R. Chokhawala, et al.

*Primary Examiner*—Timothy P. Callahan
*Assistant Examiner*—My-Trang Nu Ton
*Attorney, Agent, or Firm*—Antonelli, Terry, Stout, & Kraus, LLP

[57] ABSTRACT

For a semiconductor circuit having one or more semiconductor devices, such as an IGBT, a turn-ON prevention circuit is provided for each device which prevents the device from turning ON during OFF times thereof, due to the presence of a transient voltage (dV/dt) across the main terminals of the device. In accordance with such a scheme, a MOSFET is connected between the insulated-gate electrode and emitter of the IGBT, and a capacitor, for example, is connected between the gate of the MOSFET and a sufficient electric potential to thereby effect a temporary turn-ON of the MOSFET to remove parasitic charge build-up in the IGBT before such charge build-up has reached a potential of the turn-ON threshold of the IGBT during OFF times of the IGBT. The capacitance element can be constituted by a MOSFET, namely, the capacitance across the gate-to-drain of an additional MOSFET. As a result, therefore, power consumption can be kept sufficiently small and the chip area required for implementing the circuit, such as, in a monolithic construction can be reduced. Further, the turn-ON prevention scheme can be applied to MOSFET devices rather than IGBTs.

4 Claims, 7 Drawing Sheets

SEMICONDUCTOR CIRCUIT HAVING TURN-ON PREVENTION CAPABILITY OF SWITCHING SEMICONDUCTOR DEVICE DURING OFF CYCLE THEREOF BY UNDESIRED TRANSIENT VOLTAGES

BACKGROUND OF THE INVENTION

The present invention relates to a semiconductor circuit utilizing a MOSFET and a semiconductor apparatus employing IGBTs and a monolithic semiconductor integrated circuit thereof.

As for a voltage driven type semiconductor apparatus such as one employing an insulated-gate-bipolar transistor (hereinafter called an IGBT), a MOS type field-effect transistor (hereinafter called a MOSFET), etc., high-speed switching thereof is possible. Therefore, the apparatus may be driven with a high frequency signal if the semiconductor apparatus is applied to an inverter apparatus for driving a motor. Accordingly, size and weight of the apparatus and noise from the apparatus may be minimized. However, in the high frequency inverter apparatus, when the semiconductor apparatus is switched ON and OFF, a large voltage resulting from dV/dt (i.e., transient voltage activity) is applied into the semiconductor apparatus suddenly. As a result, therefore, the IGBT and the MOSFET malfunction and turn ON in a period when they should be turned OFF. In such a case, a short circuit accident of upper or lower arms of the inverter apparatus occurs. Moreover, in a case of a monolithic semiconductor integrated circuit in which a circuit of the inverter apparatus is monolithically provided as one semiconductor chip, such a malfunction would lead to the semiconductor chip becoming irreversibly damaged.

A conventional technology for preventing false switching action of such semiconductor apparatus is described in Japanese Patent Laid-Open No 63-99779 (1989), for example.

This aforementioned Japanese publication shows a circuit for biasing a gate of the MOSFET by connecting the MOSFET between a gate and an emitter of the IGBT of the main circuit and by connecting the gate of the MOSFET to a power supply for driving the gate of the IGBT through a resistor element. With this type of circuit arrangement, when the IGBT is in an OFF state, the gate of the MOSFET becomes biased such that the MOSFET is switched ON which leads to a short circuit between the gate and the emitter of the IGBT. Thereby, even if a large voltage of dV/dt is applied between the collector and the emitter of the IGBT, the IGBT does not wrongly change state from its OFF state.

In accordance with such conventional technology, however, when the IGBT is in an OFF state, the consumption of electric power increases because the MOSFET is always set in the ON stage when the IGBT is in its OFF state. Further, a resistor element having a high resistance value and a high withstand voltage becomes necessary, and the chip area therefore becomes large when the inverter circuit is monolithically provided as a single semiconductor chip.

SUMMARY OF THE INVENTION

The present invention overcomes problems such as those mentioned above. That is, according to the present invention, low electric power consumption of the circuit is achieved and chip area reduction of a monolithic design scheme is realized.

A semiconductor circuit (e.g., a semiconductor switching element) of the present invention has a first semiconductor device (or switching element) having a pair of main electrodes and an insulated-gate electrode, and a second semiconductor device (or switching element) having a first main electrode, a second main electrode and a control electrode. Here, the first and the second main electrodes of the second semiconductor device are connected between the insulated-gate electrode of the first semiconductor device and one of the main electrodes thereof. A capacitance element is connected between a control electrode and a settlement electric potential (or operating potential) of the second semiconductor device. The other one of the main electrodes of the first semiconductor device is applied with a drive voltage (e.g., a supply voltage).

According to the integrated circuit of present invention, the semiconductor circuit described above is formed on a single semiconductor substrate.

According to a semiconductor circuit of the present invention, when the voltage applied between a pair of main electrodes of the first semiconductor device (or switching element) changes, a displacement electric current flows in the capacitance element. Because this displacement electric current is supplied as a control signal to the control electrode of the second semiconductor device (or switching element), the second semiconductor device is turned ON. As a result, therefore, the insulated-gate electrode of the first semiconductor device is short-circuited with one of the main electrodes thereof, and turn ON of the first semiconductor device by dV/dt (false movements) may be prevented.

Figure 1:
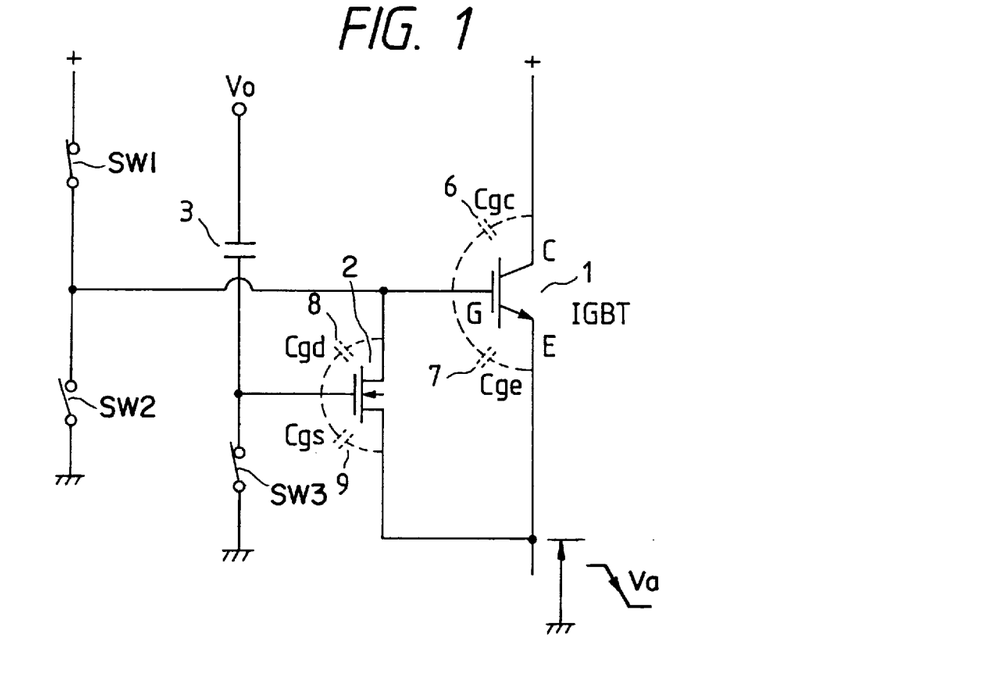
FIG. 1 is an example of a basic circuit diagram of a semiconductor switching circuit according to the present invention.

The operation and, in particular, the switching operation of the semiconductor circuit of the present invention are explained using the FIG. 1 illustration.

FIG. 1 of the drawings illustrates an example of a basic circuit diagram of a semiconductor switching circuit of the present invention. Switches SW1 and SW3 are closed (opened) and SW2 is opened (closed) in an ON (OFF) state of IGBT 1. When a transiently changing voltage is applied between the collector and the emitter (a pair of the main electrodes) of the IGBT 1 (the first semiconductor device), a displacement electric current flows between electric potential V0 and the emitter electrode (one of the main electrodes) of the IGBT 1 through a path including a capacitor 3 (the capacitance element), a MOS gate (the control electrode) of a MOSFET 2 (the second semiconductor device) which effects a gate short circuit, and a source electrode (the second main electrode) of MOSFET 2. Parasitic capacitances 8 and 9 are charged by the displacement electric current, thereby effecting an ON state of the MOSFET 2. On the other hand, in the IGBT 1, the parasitic capacitances Cgc 6, Cge 7 are charged in the same way. However, as the gate and the emitter of the IGBT 1 are short-circuited as a result of the switching of MOSFET 2 into the ON state, electric charges of the parasitic capacitances 6 and 7 are discharged through the drain-to-source path of MOSFET 2. Accordingly, the IGBT 1 is not switched to an ON state because the gate voltage of the IGBT 1 has not risen.

Since the displacement electric current flows, according to such a scheme, only when the voltage changes, the electric power consumption of the circuit is reduced.

In an integrated circuit of the present invention, during the formation of the semiconductor circuit of the present invention on the semiconductor substrate, a protection circuit portion may be provided by using a resistance element having a high resistance value of a high voltage resistance. Accordingly, the chip area may be reduced.

DETAILED DESCRIPTION OF THE PREFERRED EMBODIMENTS

Figure 2:
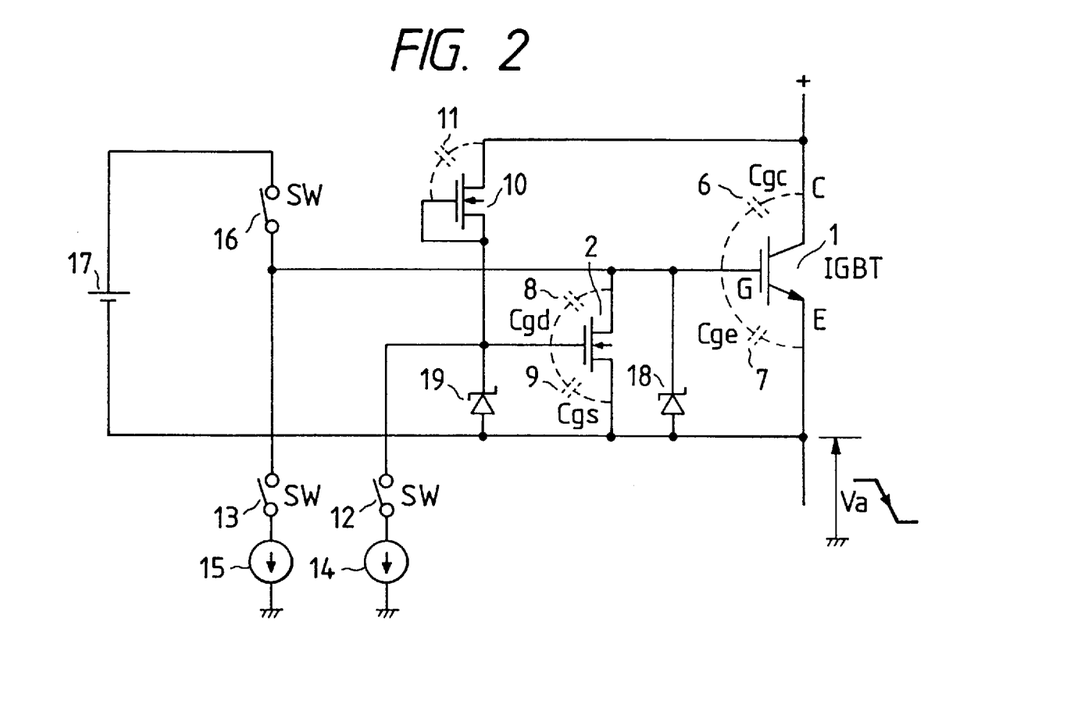
FIG. 2 is a detailed circuit construction of one embodiment of the present invention.
Figures 3A, 3B, 3C:
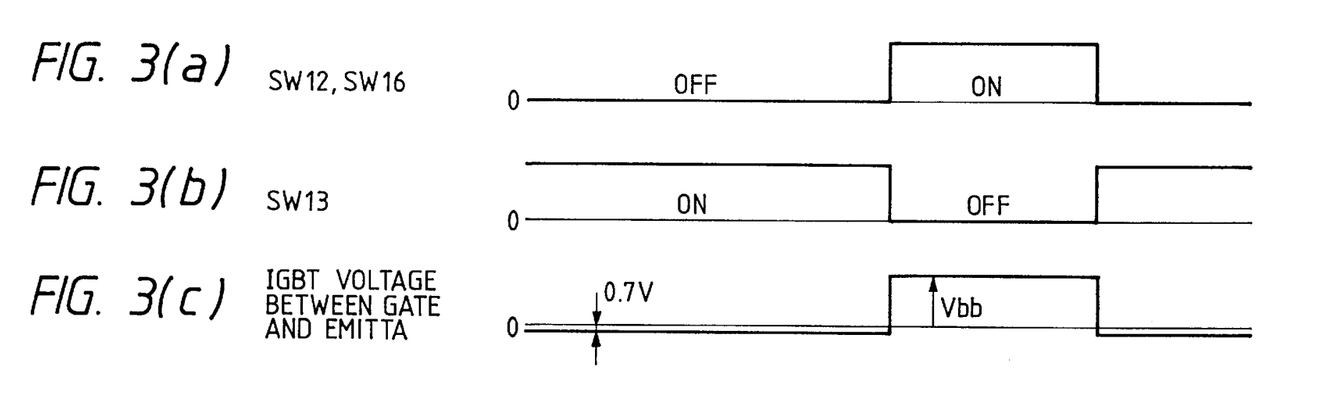
FIGS. 3(a), 3(b) and 3(c) show waveforms indicative of the operation state of switches SW12 and SW16, switch SW13 and the gate-to-emitter voltage of the IGBT 1, respectively, in the circuit shown in FIG. 2.
Figure 4A:
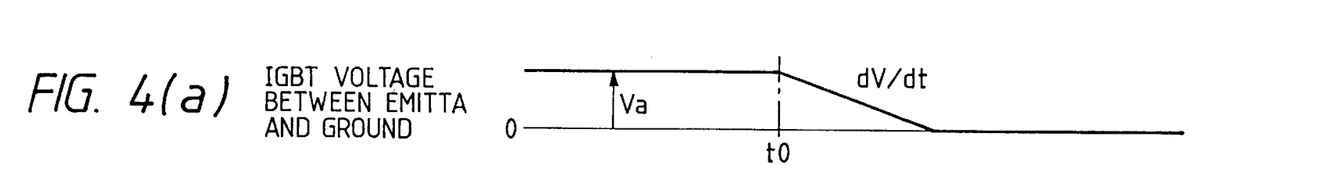
FIGS. 4(a)–4(c) are waveforms indicative of the operation of the circuit shown in FIG. 2 with regard to transient voltage changes.

A circuit according to an embodiment of the present invention is shown in FIG. 2, movement conditions of the circuit are shown in FIG. 3 and the voltage that is, furthermore, transiently changed (hereinafter called dV/dt) and circuit movements (or changes) resulting therefrom are shown in FIG. 4.

In such an embodiment, a MOSFET is used as the capacitance element, one end thereof is fixed at a collector voltage of the IGBT.

At first, the movements will be explained when the IGBT 1 is ON. In the circuit movements condition in FIG. 3, the switches 12, 16 are ON. The switch 16 supplies the voltage Vbb from a main power supply 17 to a gate of the IGBT 1. The closing of switch 12 discharges the charge built-up between a gate and source of MOSFET 2 (which is for effecting a gate short circuit between the gate and emitter of IGBT 1) through a constant current source 14 and works to surely make the MOSFET 2 OFF. The switch 13 is OFF in order to prevent an offsetting of the closing of switch 16.

The movements will now be explained when the IGBT 1 is in an OFF state. In the circuit movements condition shown in FIG. 3, the switch 12 is shown to be initially OFF, the switch 13 is ON and the switch 16 is OFF. Actually, a semiconductor switching element is used as each switch here. A constant current flows into a constant current source 15 through a zener diode 18 by switching on a switch 13, and a reverse bias of approximately 0.7 V is added between the gate and the emitter of the IGBT 1. On the other hand, since the switch 12 is OFF, the gate of MOSFET 2 transiently changes toward the voltage that is defined by a division ratio of the parasitic capacitance 11 of N-MOSFET 10 to the parasitic capacitances 8 (Cgd) and 9 (Cgs) of the MOSFET 2. But, it is clamped by a zener voltage of the zener diode 19.

Figure 4B:
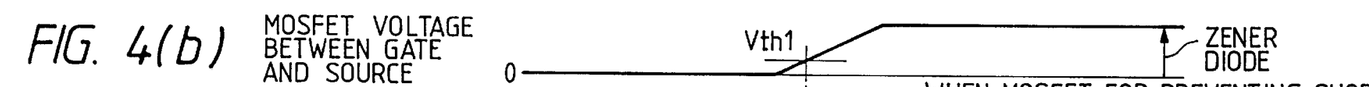
Figure 4C:
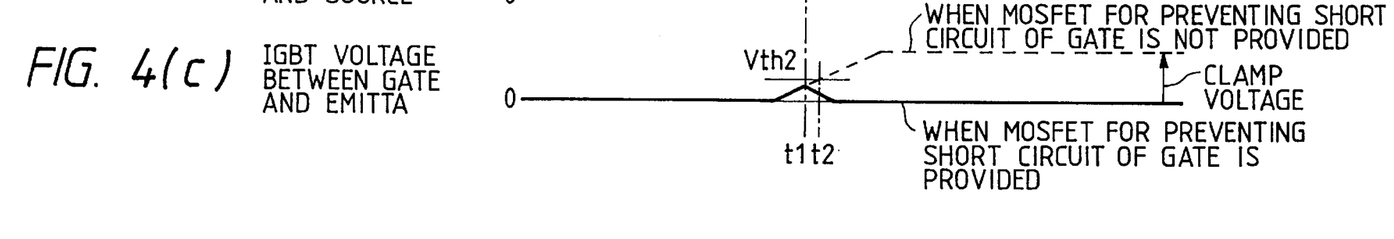

In this state, when the voltage Va between the emitter of the IGBT 1 and ground is transiently lowered to 0 V from an arbitrary voltage Vx, movements are explained using FIG. 4 as follows. Here, an initial condition of the electric charge of the parasitic capacitances 8 and 9 of the MOSFET 2, used for effecting the gate short circuit, is defined as zero. When, in FIG. 4, a lowering of the voltage has occurred at a point in time of t0, the parasitic capacitance 11 and the parasitic capacitances 8 and 9 of the MOSFET 2 have begun to be charged with the electric charge, the voltage between the gate and the source of the MOSFET 2 begins to rise, as shown in FIG. 4(b). When this voltage is charged up to the threshold level (Vth1), of the MOSFET 2, the MOSFET 2 is switched ON. As shown in FIG. 4(c), the voltage between the gate and the emitter of the IGBT 1 rises by the charging of the parasitic capacitances 6 (Cgc) and 7 (Cge) with electric charge. If the MOSFET 2 is not provided then, the voltage between the gate and the emitter of the IGBT 1 changes like a dotted line of FIG. 4(c), exceeds the threshold voltage level (Vth2) of the gate of the IGBT, and the IGBT turns on. However, because of the presence of MOSFET 2, MOSFET 2 turns on at time t1 and the gate-emitter of the IGBT is short-circuited. As a result, therefore, the parasitic capacitance 7 is discharged, and the voltage between the gate and the emitter of the IGBT does not reach the threshold voltage level so as not to turn on the IGBT. Accordingly, false movements (e.g., improper ON/OFF switching operation) because of the (dV/dt) may be prevented.

Power loss in the capacitance element in this embodiment, it is noted, hardly occurs, i.e., power consumption is rather small compared to the case using the resistance element. Accordingly, with this type of embodiment, electric power consumption can be reduced. Also, because this embodiment uses the capacitance of the MOSFET 10 as the capacitance element, if applied to an integrated circuit, the size of the chip can be reduced too.

Figure 5:
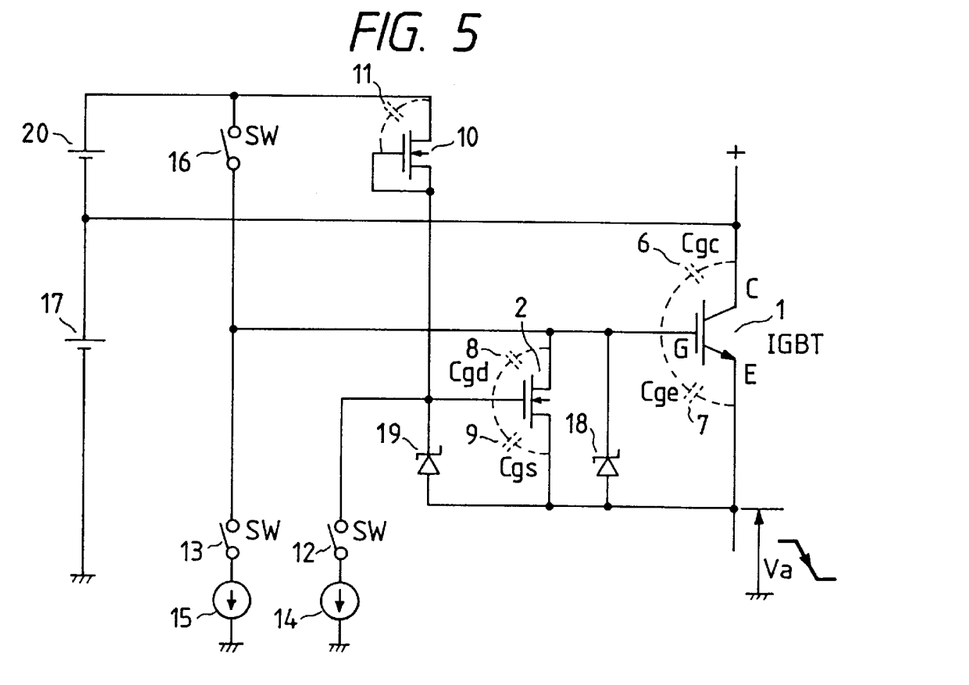
FIG. 5 is another embodiment according to the present invention.

Another embodiment exemplifying the present invention which will now be discussed is shown in FIG. 5 of the drawings. The MOSFET 10 is used as the capacitance element in this embodiment too, and has one end thereof fixed at a voltage of the power supply for gate drive. That is, a power supply 20 for driving the gate of the IGBT has a low potential side connected to a high potential side of the main power supply 17 and to the collector of IGBT 1, and has a high potential side connected to a drain of the N-MOSFET 10 and to the gate of IGBT 1 via switch 16.

Operation of the embodiment in FIG. 5, as it responds to transient voltage changes effected, namely, dV/dt, between the collector and emitter of IGBT 1, will now be explained. When the IGBT 1 is in an OFF state, the switches 16, 12 are OFF and the switch 13 is ON in the same way as in FIG. 2. The parasitic capacitance 11 of the N-MOSFET 10 is charged to a voltage equal to the voltage of the main power supply 17+the voltage of the power supply 20 for driving the IGBT−Va+zener voltage of the zener diode 19. When the voltage dV/dt is generated, the switching operation is similar to the case of the previous embodiment.

In this embodiment, because the MOSFET used as the capacitance element for prevention of false movements is connected to the gate circuit side, any interference between the main circuit side and the gate circuit side through this capacitance element is not likely to occur. On this account, when a circuit of this embodiment is formed as part of a monolithic construction in a semiconductor chip, it becomes easy to provide a layout of the element in a manner in which the main circuit part and the gate circuit part do not interfere with each other.

Figure 6:
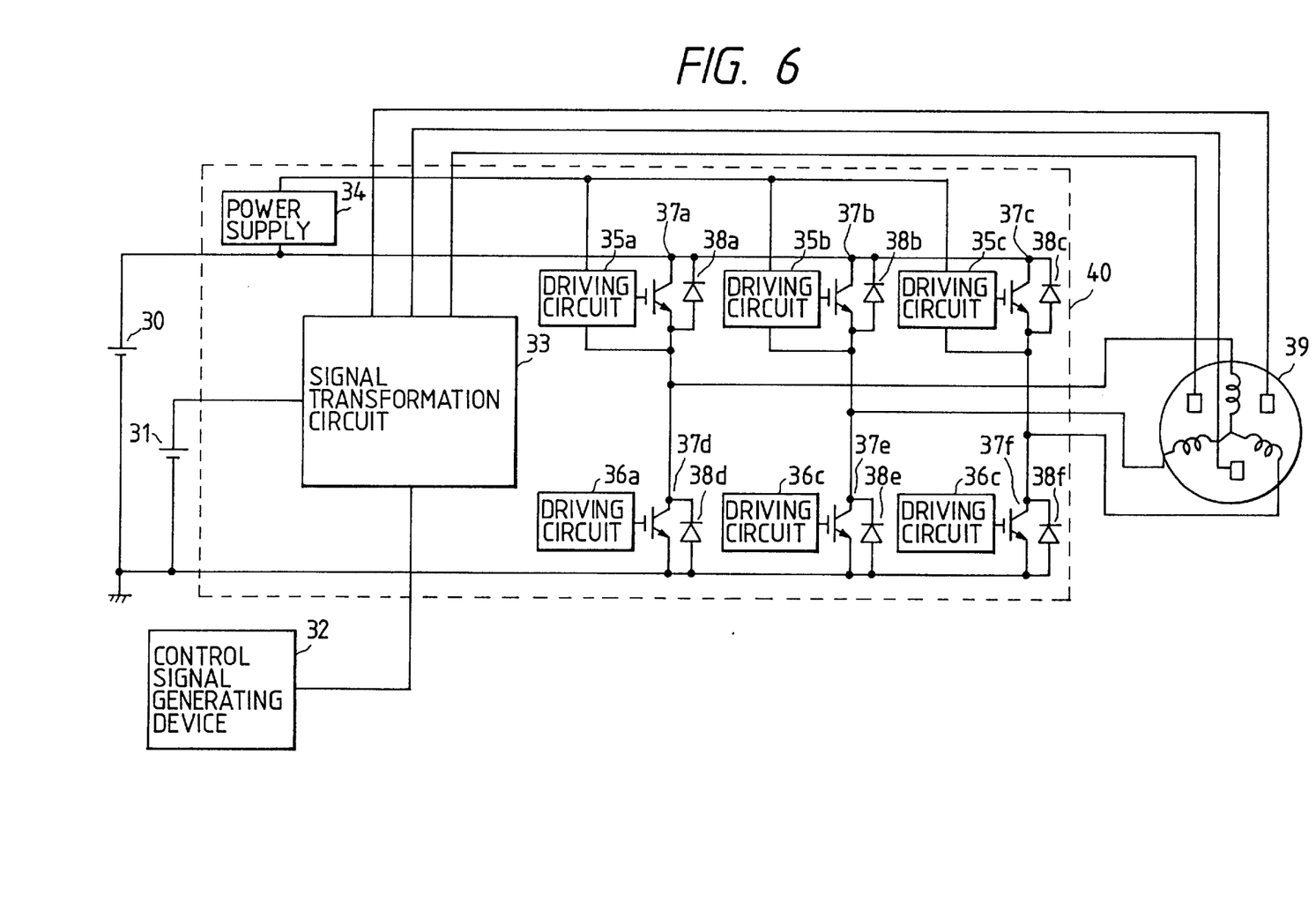
FIG. 6 is an embodiment of a monolithic inverter circuit for driving a three phase brushless motor using a circuit shown in FIG. 5.

FIG. 6 shows an embodiment of a monolithic inverter circuit 40 shown with a dotted line for driving a 3 phase brushless motor using a circuit shown in FIG. 5. In FIG. 6, power supply 30 for driving the motor is a power supply for driving 3 phase brushless motor 39 in which a hall element for detecting a magnetic pole position of the rotator is built in. The power supply 30 for driving the motor is connected with a 3 phase bridge circuit which is constructed with the IGBT 37a to 37f and freewheeling diodes 38a to 38f which are connected in a reverse juxtaposition respectively therewith. A power supply 31 for a monolithic IC control is a power supply for driving a signal transformation circuit 33 which receives and divides an output signal from a gate drive circuit 36a to 36c of lower arm IGBT 37d to 37f and from the hall element built-in the motor 39. Power supply circuit 34 is a circuit for generating the voltage supplied to the gate drive circuit 35a to 35c of an upper arm IGBT 38a to 37c. Accordingly, the apparatus constitution becomes simple because the outside gate power supply for an upper arm becomes unnecessary. Also, the control signal generating device 32 of monolithic IC is a circuit for controlling an ON-OFF duty ratio of the IGBT of each arm. The inner part enclosed with a broken line is constructed with the monolithic IC40 in the figure.

The parts applied with a circuit shown in FIG. 5 in an above-mentioned circuit correspond to upper arm drive circuits 35a to 35c. The power supply 20 for driving the IGBT in FIG. 5 corresponds to the power supply 34 of this embodiment here. In other words, a circuit of FIG. 5 is suitable in the inverter circuit as shown in FIG. 6. In this embodiment, in the bridge constitution shown in FIG. 6, any false movements e.g., undesired turn ON of an IGBT, in an upper arm of the inverter will not arise even if a transient voltage (dV/dt) is applied by a chopping of the lower arm IGBT 37a to 37f.

Figure 7:
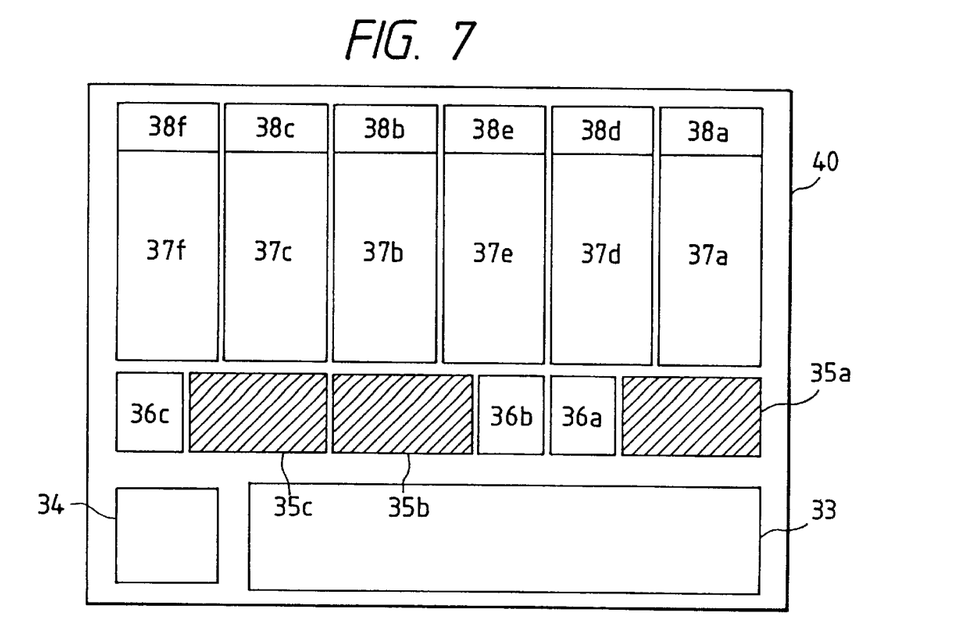
FIG. 7 is an example of a pattern layout of a monolithic IC shown in FIG. 6.

FIG. 7 shows an example of a pattern layout of monolithic IC 40 in FIG. 6. Symbols shown in this figure correspond to that in FIG. 6, in which the upper arm drive circuits correspond to the hatched parts 35a to 35c of the figure and in which the false movements prevention circuit, shown in FIG. 5, is respectively formed in the blocks 35a to 35c, in FIG. 6. Accordingly, in circuits which use resistance elements conventionally, chip size and electric power consumption thereof become substantial, because a plurality of resistance elements having a high voltage resistivity and a high resistance value is necessary. On the contrary, in this embodiment, since the circuit is constructed with the capacitance of the MOSFET, both the chip size and the electric power consumption are reduced considerably more than in the conventional way.

Figure 8:
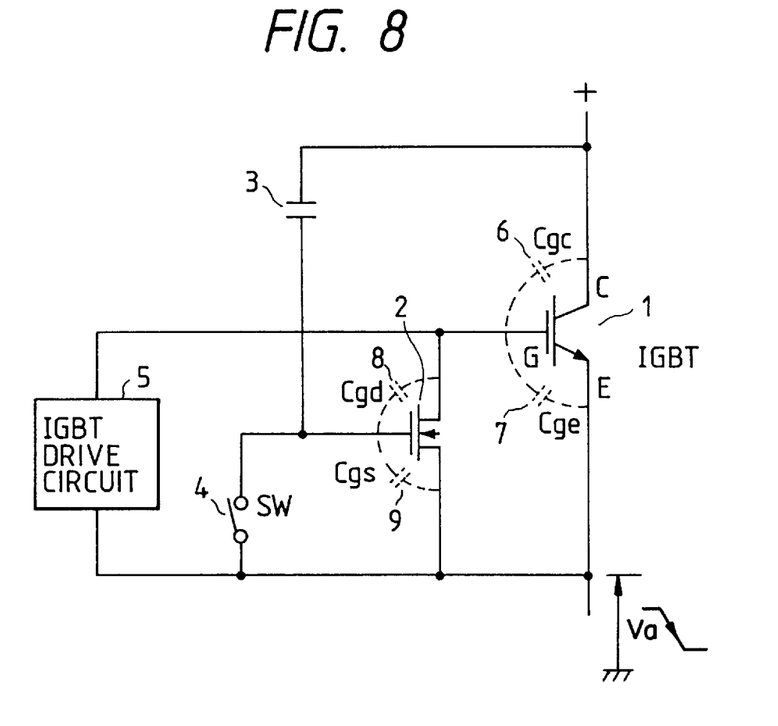
FIG. 8 is a still further embodiment according to the present invention.

FIG. 8 shows a semiconductor circuit according to a still further embodiment of the present invention. Between the gate of the MOSFET 2 and the collector of the IGBT 1, usual capacitor 3 (dielectric member is put between two metal electrodes) is connected. The capacitor 3 transmits an electric current only when the transient voltage (dV/dt) occurs between the collector and the emitter of the IGBT 1, at which time, parasitic capacitances Cgd 8, Cgd 9 between the gate and the sources of the MOSFET 2 are charged so as to turn on the MOSFET 2. As the means for turning OFF the MOSFET 2 (which is for effecting a gate-emitter short circuit of IGBT 1), in addition to the above, switch 4 is provided between the gate and the source thereof which discharges any built-up electric charge across the gate parasitic capacitances 8 and 9 of the MOSFET 2, respectively. As the switch 4, a semiconductor switching element is used. According to a signal for controlling the switch 4 and the IGBT drive circuit 5, the IGBT is turned OFF within a period for protecting the IGBT 1 from the voltage (dV/dt) and at an OFF period of the IGBT 1, and is turned ON within a period for turning ON the IGBT 1 and within a period of ON state of the IGBT 1.

In the above-mentioned embodiment the switching element of the main circuit is an IGBT, but the present invention may be applied to a case in which an insulation gate type semiconductor apparatus, such as a MOSFET, is used for the main circuit. A bipolar transistor may also be used instead of using a MOSFET for effecting the gate-emitter short circuit. In this case, the capacitance element would be connected to a base of the bipolar transistor. The present invention may be applied to not only an inverter apparatus as heretofore described but also to another apparatus which may be different or a modification therefrom in which the transient voltage (dV/dt) is added to the switching element thereof. Furthermore, the circuit used in such apparatus can be effected not only as an integrated circuit but also as a single body element or a module construction.

Figure 9:
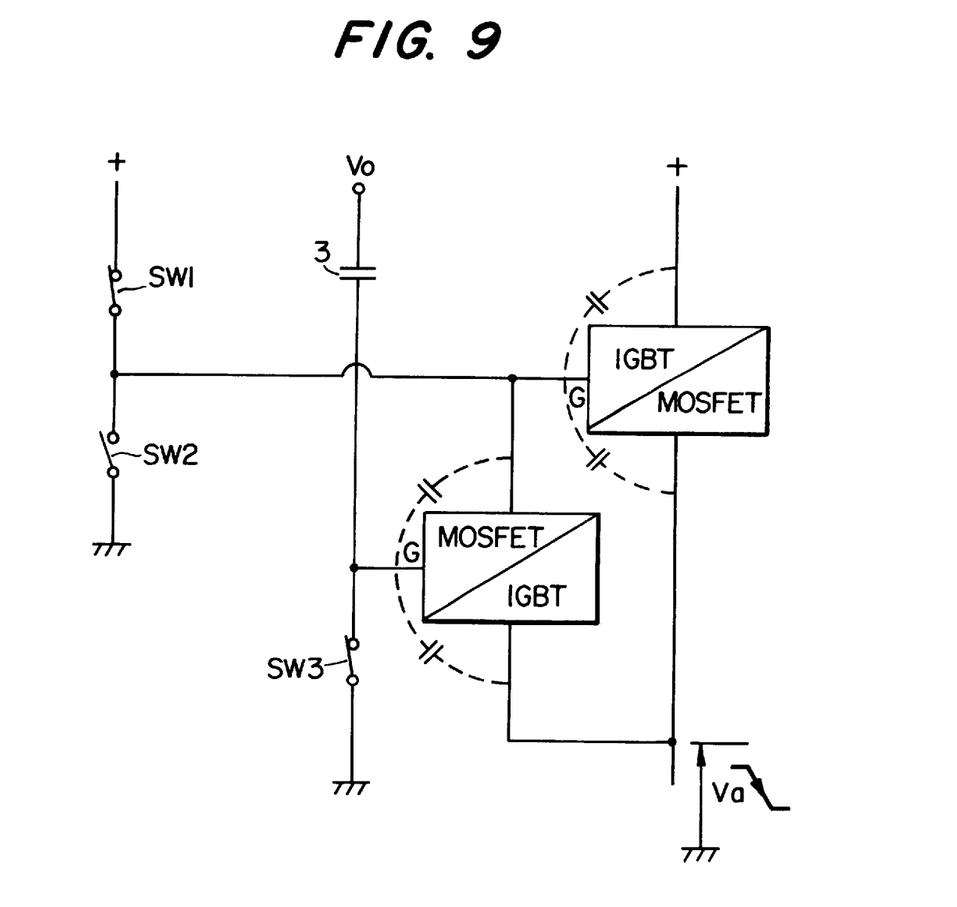
FIG. 9 is another embodiment illustrating a modification of the basic circuit of the present invention.
Figure 10:
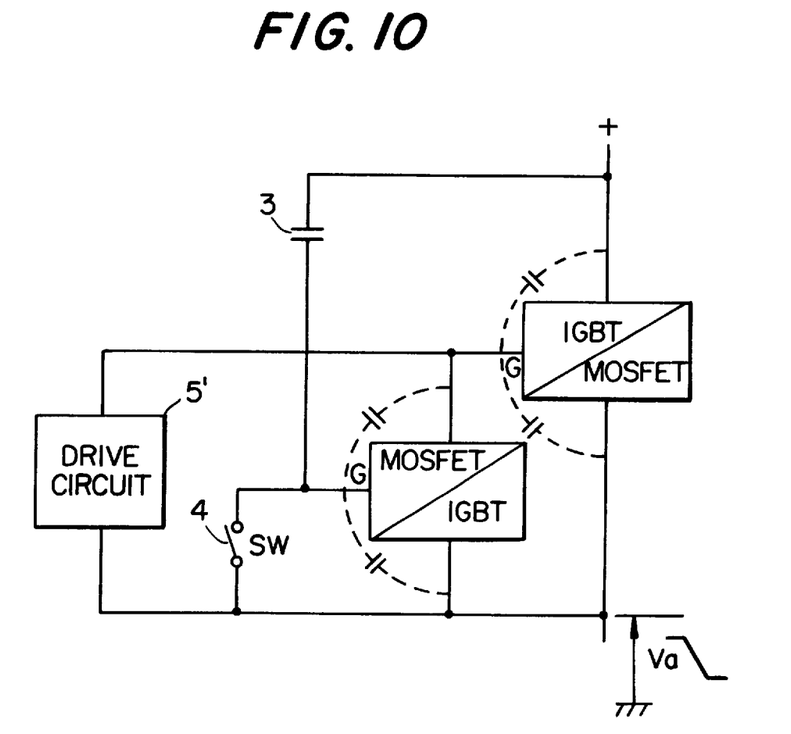
FIG. 10 is an illustration of a modification of the embodiment shown in FIG. 8.

FIG. 9 represents another embodiment exemplifying a modification of the basic circuit of the invention, described hereinabove, with regard to FIG. 1 of the drawings. In FIG. 9, the operation is similar to that described with regard to FIG. 1 and, for purposes of description, similarly numbered component elements in both figures and in other illustrations, where applicable, have similar functions and are of the same type. FIG. 9 shows that both the first semiconductor device (e.g., device 1 in FIG. 1) and the second semiconductor device (e.g., device 2 in FIG. 1) in the switching circuit (apparatus) can be implemented with different types of semiconductor switching elements, as shown therein. Such a modification can also be effected with respect to the circuit illustration in FIG. 8 of the drawings, namely, in a manner according to the illustration in FIG. 10 of the drawings. In FIG. 10, also, as well as in other illustrations, where applicable, component elements which are similarly numbered to that included in FIG. 8 have similar functions and are of the same type. Since the operation of FIGS. 9 and 10 are similar to that given with respect to FIGS. 1 and 8, respectively, additional discussion pertaining thereto will not be provided therefor.

In addition to the above description regarding the construction of the present invention, the circuit forming the semiconductor apparatus for the gate-emitter short circuit and the capacitance element also operates, in effect, as a (dV/dt) detection circuit. Therefore, according to the output signal of such detection circuit, the false movements (i.e., false ON/OFF switching operations) of the main circuit semiconductor apparatus may be prevented by outputting an OFF control signal from the drive circuit of the semiconductor apparatus of the main circuit.

According to the semiconductor circuit of the present invention, because the gate short circuit works and the false movements of the semiconductor apparatus are prevented only when the transient voltage (dV/dt) occurs, the electric power consumption is effectively reduced as compared with that of the conventional technology.

When implementing a circuit of the present invention in a monolithic IC construction, since a resistance having a high voltage resistivity and high resistance value (which ordinarily require a big cell area) are not necessary, the chip area may be reduced effectively.

What is claimed is:

1. A semiconductor switching circuit comprising:
   at least a pair of first semiconductor devices, connected in series between terminals of a direct current power supply potential, each having a pair of main electrodes and an insulated-gate electrode, wherein a common node of the series-connected pair of said first semiconductor devices is used to derive an output;

at least one second semiconductor device each having a first main electrode, a second main electrode and a control electrode, said first main electrode thereof being connected to the insulated-gate electrode of one of said first semiconductor devices, and said second main electrode thereof being connected to one of the pair of main electrodes of said one of said first semiconductor devices; and at least one capacitance element each of which has a first electrode connected to the control electrode of a respective one of said at least one second semiconductor device and a second electrode coupled to receive a fixed electric potential, wherein said at least one second semiconductor device includes a plurality of second semiconductor devices and said at least one capacitance element includes a plurality of capacitance elements equal in number to the number of said second semiconductor devices, each said capacitance element having the second electrode thereof applied with said fixed electric potential and the first electrode thereof coupled to the control electrode of a corresponding one of said second semiconductor devices, wherein aid at least a pair of first semiconductor devices is comprised of a parallel arrangement of plural pairs of series-connected first semiconductor devices across an operating voltage, corresponding to said direct current power supply potential, to form an inverter circuit, the common node connection of each and every such series-connected pair is coupled to a driving terminal of a load circuit, and wherein said operating voltage constitutes a portion of the potential of said fixed electric potential applied to said capacitance elements, respectively.

2. A semiconductor switching circuit according to claim 1, wherein each of said first semiconductor devices includes an insulated-gate-bipolar transistor or a MOS field effect transistor.

3. A semiconductor switching circuit, formed on a semiconductor body, comprising:

at least a pair of first semiconductor devices, connected in series between terminals of a direct current power supply potential, each having a pair of main electrodes and an insulated-gate electrode, wherein a common node of the series-connected pair of said first semiconductor devices is used to derive an output;

at least one second semiconductor device each having a first main electrode, a second main electrode and a control electrode, said first main electrode thereof being connected to the insulated-gate electrode of one of said first semiconductor devices, and said second main electrode thereof being connected to one of the pair of main electrodes of said one of said first semiconductor devices; and at least one capacitance element each of which has a first electrode connected to the control electrode of a respective one of said at least one second semiconductor device and a second electrode coupled to receive a fixed electric potential, wherein said at least one second semiconductor device includes a plurality of second semiconductor devices and said at least one capacitance element includes a plurality of capacitance elements equal in number to the number of said second semiconductor devices, each said capacitance element having the second electrode thereof applied with said fixed electric potential and the first electrode thereof coupled to the control electrode of a corresponding one of said second semiconductor devices, wherein said at least a pair of first semiconductor devices is comprised of a parallel arrangement of plural pairs of series-connected first semiconductor devices across an operating voltage, corresponding to said direct current power supply potential, to form an inverter circuit, the common node connection of each and every such series-connected pair is coupled to a driving terminal of a load circuit, and wherein said operating voltage constitutes a portion of the potential of said fixed electric potential applied to said capacitance elements, respectively.

4. A semiconductor switching circuit according to claim 3, wherein each of said first semiconductor devices includes an insulated-gate-bipolar transistor or a MOS field effect transistor.

* * * * *